United States Patent Office 3,434,896

Patented Mar. 25, 1969

3,434,896

PROCESS FOR ETCHING SILICON MONOXIDE AND ETCHANT SOLUTIONS THEREFOR

Dudley A. Chance, Poughkeepsie, N.Y., assignor to International Business Machines Corporation, Armonk, N.Y., a corporation of New York No Drawing. Filed July 30, 1965, Ser. No. 476,165
Int. Cl. H01l 7/50; B32b 31/24
U.S. Cl. 156—17 10 Claims

ABSTRACT OF THE DISCLOSURE

Silicon monoxide is etched with an etchant comprising an aqueous alkaline solution of ammonium fluoride. The etching is conducted at a temperature of 50° to 100° C. The alkaline component is preferably ammonium hydroxide.

This invention relates to the surface treatment of electrical components, more particularly to a process for preferentially etching silicon monoxide coatings and etchant solutions therefor.

During various stages of the manufacture of electrical components, particularly miniaturized semiconductor devices, oxide and glass coatings are frequently formed on the surfaces of the component bodies. For example, in the production of diffused junction semiconductor devices, an oxide coating is disposed over predetermined portions of the semiconductor body to act as a diffusant mask during a subsequent diffusion operation. In practice, the semiconductor body is first coated with the oxide or glass, and then predetermined portions of the coating are removed to expose various regions of the underlying semiconductor material into which an active impurity is subsequently diffused.

Glass is well known and widely used as an insulating coating, and as a masking coating on electrical component devices. Normally in forming glass coatings on the substrate of an electrical component, the substrate is heated to temperatures above 500° C. This process is generally limited to coating materials which can stand the high temperature. The forming of a silicon dioxide coating also requires that the base material be heated to relatively high temperatures. One common method of forming a genetic layer involves heating a base member of silicon to a temperature between 900°–1400° C. in an oxidizing atmosphere saturated with water vapor or steam. The exposed silicon is oxidized forming an exterior coating of silicon dioxide. Another common method of forming a silicon dioxide coating is to heat the base member in an environment containing vapors of an organic siloxane compound to a temperature below the melting point of the material of the base member but above that which siloxane decomposes. This temperature is normally above 700° C. Thus glass and silicon dioxide coatings can be applied by known techniques to only materials which have relatively high melting or sublimation temperatures.

In contrast, a silicon monoxide coating can be applied to a surface at a temperature much lower than 500° C. Silicon monoxide coatings can be applied to some types of materials without heating the materials materially above room temperature.

While glass and silicon dioxide coatings, and etching techniques therefor, work well, there are many instances where they are not usable. Silicon dioxide and glass can be easily etched with various hydrofluoric acid solutions. Common procedure is to apply a mask coating over the layer of oxide or glass on a base, usually by photo resist techniques, and etch the glass or silicon dioxide with hydrofluoric acid which attacks the oxide or glass but not the underlying elemental material of the base. In some instances it is desirable to use an underlying material, as for example metals, which will be attacked by the hydrofluoric acid etching solution. In such situations the use of a silicon dioxide or glass coating is not feasible since the base will be adversely affected by the hydrofluoride etchant.

While it is well known that silicon monoxide coatings can be put down on various materials at a much lower temperature than glass or silicon dioxide, these coatings have not been widely used because of difficulties of shaping the coating to specific patterns. Since no suitable etchant is known in the art for silicon monoxide, conventional photo resist techniques can not be used. Normal practice in laying down a coating of silicon monoxide is to place a metal mask in overlying direct contact with the base and then apply silicon monoxide over the mask and base. A coating will be formed on the areas of the base that are exposed. This technique is satisfactory in the formation of simple patterns, but is completely unsatisfactory when a complex pattern is necessary. For example, when a coating with an accurately positioned circular opening is required, common practice is to provide a metal mask with a circular blanking portion that is held in position with relatively thin generally radiating members. In order to prevent the radiating members from preventing the deposition of silicon monoxide, the mask must be periodically rotated or otherwise moved to place the members in different positions and yet retain the blanking portion in the same position in order to allow a relatively uniform coating of silicon monoxide to form. This procedure is tedious and painstaking, usually results in poorly defined edges, and is practically with only very simple patterns.

Various etching solutions for silicon monoxide, such as hydrofluoric acid, etc., have been proposed, but none have proven satisfactory. Hydrofluoric acid is generally unsatisfactory because silicon monoxide does not etch uniformly and often a residue is left on the surface. Also, the etched edge boundaries that result when using a hydrofluoric acid etchant are jagged, chipped, and in general very irregular. The boundaries of an etched silicon monoxide coating are in general so irregular that photo resist etching techniques known to the prior art used in conjunction with known etchants cannot be used satisfactorily in the production of modern miniaturized components.

It is thus an object of this invention to provide a new process of surface treatment.

It is another object of this invention to provide a new method of surface treatment of electrical components.

Yet another object of this invention is to provide a new process for masking semiconductor materials.

Another object of this invention is to provide a new method of surface treatment of materials that are heat sensitive.

Yet another object of this invention is to provide a new process of surface treatment of materials which are subject to attack by acid media.

Still another object of this invention is to provide a new process for etching silicon monoxide.

Still another object of this invention is to provide a new etchant for silicon monoxide.

Another object of this invention is to provide a new etchant for silicon monoxide which can be used to etch silicon monoxide disposed on materials subject to attack by acid.

These and other objects are accomplished in accordance with the broad aspects of the present invention of my new method of surface treatment. In the method of the invention a silicon monoxide coating is formed on the surface of the base, and then a photo resist coating formed over the silicon monoxide coating. The base can be any suitable component, as for example, a transistor, diode, integrated circuit element, capacitor, module resistor, etc. Predetermined areas of the photo resist coating are then removed. The resultant base with the silicon monoxide coating and overlying photo resist coating is then exposed to an etchant maintained at a temperature in the range of 50°–100° C., whereupon the exposed silicon monoxide coating is removed. The etchant of the invention is an aqueous alkaline solution of ammonium fluoride having a concentration in the range of 1–14 moles per liter with a pH in the range of 7.5–14.

The new method of masking makes possible the forming of an impervious silicon monoxide coating having sharply defined boundaries on materials that cannot be subjected to high temperatures and/or which are attacked by acid solutions. The new method of masking eliminates the expensive, tedious and painstaking, masking procedures with overlying masking plates normally used to confine silicon monoxide coatings to specific areas on bases.

The new etchants of the invention solve the problems associated with the accurate forming, and removal of silicon monoxide coatings. The new etchant of the invention will quickly and efficiently remove silicon monoxide coatings from base materials which are attacked by acid media. The new etchant of the invention removes unmasked portions of silicon monoxide coatings leaving sharply defined region boundaries. Further, the etchant does not undercut photo resist coatings applied over silicon monoxide coatings. The etchant of the invention greatly simplifies the forming of the silicon monoxide coating on a substrate thereby lowering the cost of production and increasing reliability.

A presently preferred etchant of the invention is an aqueous basic preparation of ammonium fluoride of a concentration in the range of 1–14 moles per liter, more preferably 8–12 moles per liter, and most preferably 10 moles per liter. The preparation has a pH in the range of 7.5–14, more preferably 8–10, and most preferably a pH of 9. The etchant is prepared by combining water and ammonium fluoride to form the desired concentration. An alkaline agent is added, or otherwise combined, to give the resultant preparation the desired pH. The alkaline agent can be sodium hydroxide, potassium hydroxide, lithium hydroxide, ammonium hydroxide, ammonia, and the like. A most preferred alkaline agent is ammonium hydroxide.

In the presently preferred method of masking a base of the invention, a silicon monoxide coating is first formed on the surface of the base. The coating can be formed by vacuum deposition. Vacuum deposition normally involves evaporating silicon monoxide in an evacuated chamber with the base in the chamber in a position to cause the evaporated silicon monoxide to condense on same. The thickness of the coating is controlled by the distance between the silicon monoxide source and the base, and the length of exposure. The silicon monoxide coating can be of any suitable thickness, but preferably is in the range of ½ to 2 microns. A photo resist coating is then formed on the silicon monoxide coating. The desired pattern is formed in the photo resist coating by conventional exposure and photo resist etching techniques. Typical photographic resist materials are disclosed in U.S. Patents 2,670,285, 2,670,286 and 2,670,287 of Louis M. Minsk et al. Conventional methods of applying such materials may be employed, such as brushing, dipping, spraying, or the like. It is important before applying the resist materials to insure a clean surface by the use of suitable cleaning agents, for example benzol, toluene, or like solvents. The resultant photo resist masked base is then exposed to the action of the etchant of the invention, which was described previously, to remove exposed portions of the silicon monoxide coating. The photo resist mask coating is not significantly affected by the silicon monoxide etchant. The substrate is preferably exposed to the etchant by immersing same in a solution thereof which is heated to a temperature in the range of 50°–100° C., more preferably 75°–95° C., most preferably 85°–90° C. The necessary exposure time to the silicon monoxide etchant is determined by the thickness of the silicon monoxide coating and the temperature, pH, and concentration of the etchant. The etchant rate will normally vary between 8 and 200 angstroms per second, more preferably between 40–100 angstroms per second. The photo resist coating is then removed by conventional means leaving the base with a silicon monoxide coating having the desired pattern thereon to permit any desired application, or further process steps such as dopant diffusion, etc. The method of the invention can be used to apply silicon monoxide coatings for any suitable purpose, such as insulating coatings for use in capacitators as a dielectric, crossovers in printed circuits, insulating carriers in integrated circuits, and the like. Normally, the aforedescribed method is utilized to simultaneously form coatings on a relatively large base which is subsequently severed to form a great many electrical components. For example, the process can be performed on a doped silicon wafer in which there are formed many individual patterns. The silicon wafer is then severed to divide same into as many as one thousand individual elements. The method of the invention has been described in terms of application to a single electrical component in the interests of clarity, but should not be interpreted to be confined to such singular applications.

In the preferred method of etching silicon monoxide of the invention, the base, or substrate, having a silicon monoxide coating thereon is exposed to the etchant of the invention which has been described previously. The base normally will have portions of the silicon monoxide suitably masked to permit selective etching of the silicon monoxide coating. The base is immersed in the etchant solution which is heated to the desired temperature.

The following examples are included merely to aid in the understanding of the invention and variations may be made by one skilled in the art without departing from the spirit and scope of the invention.

Example I

A silicon monoxide coating was applied to the polished surfaces of twenty silicon wafers, each wafer measuring one-half inch in length, one-half inch in width, and ten mils in thickness. This was done by evaporating silicon monoxide from a molybdenum boat in an evacuated bell jar at $10^{-5}$ mm. of mercury. The silicon wafers were placed six inches above the silicon monoxide source and heated to approximately 200° C. The resultant silicon monoxide coating had a thickness of 3360 angstroms. A photo resist coating was applied over the silicon monoxide coating on each wafer in the usual manner. A pattern of holes three mils and one mil in diameter were developed in the photo resist coatings using standard techniques. The resultant photo resist masked silicon monoxide coatings were then baked for one hour at 120° C. The resultant wafers were prepared for use in tests described in the following examples.

Example II

In order to determine and illustrate the effect of pH of the etchant of the invention, and to determine the optimum pH value, a series of the six wafers prepared in Example I were immersed in 10 M ammonium fluoride etchant of different pH values. Etchant solutions were prepared having pH values between 7.45 in 10 by adding ammonium hydroxide in varying quantities and measuring the pH value of each. In order to compare the effect of various alkaline solutions, one solution was prepared using potassium hydroxide to obtain an etchant solution with a pH of 10 in which a wafer was immersed. The etchant solutions were heated to 93°–95° C., and the respective wafers submersed therein until the exposed silicon monoxide coatings were etched through, and the etching times noted. From this the etch rate was computed and recorded. The boundary definition, and etching effects were noted and also recorded. The results are summarized in the following table:

TABLE I

[10 M $NH_4F$, 93–95° C.]

| | Etch Rate (A./sec.) | Observations | | |
|---|---|---|---|---|
| | | Definition | Rainbow | Other |
| pH: | | | | |
| 7.45 | ~100 | Cracking | Large | |
| 8.25 | ~100 | do | do | |
| 8.80 | ~100 | Good | Observed | Photo resist coat lifting. |
| 8.95 | ~100 | Excellent | Barely observed | |
| 9.5 | ~100 | Good | Observed | Uneven etching. |
| 9.9 | ~100 | Fair | do | |
| KOH: | | | | |
| 10 | <10 | Fair | Very broad | |

The above table indicates that the etch rate is not significantly affected by variations in the pH of the etchant solutions prepared with ammonium hydroxide. It was noted that the etch rate of the etchant prepared from KOH was much slower than the rates of the etchants prepared with ammonium hydroxide. The pH did, however, have very significant effect on the sharpness of the edge boundaries produced by the etchant. As indicated, etchants with low and high pH values produced edge definitions that were not as sharp and well defined as the etchant solutions having pH's in the intermediate range. The term "definition" is used to designate the condition of the boundary edge of the silicon monoxide coating. It was noted that etchants having pH's of 8.25 and less produced cracking and chipping of the silicon monoxide layer. An indication of the edge boundary shape is indicated by observing the "rainbow" effect about the opening. There is a tendency for the etchant to undercut the photo resist layer and to thereby form a tapered boundary or edge in the silicon monoxide layer. This tapered boundary is analogous to a prism and refracts light thereby producing a "rainbow" effect. The more tapered the boundary, the greater the "rainbow" effect. It is noted that etchants having a pH in the intermediate ranges produced etch boundaries having the least "rainbow" effect, indicating a steeper or more transversely extending edge wall. The example indicates that a pH of approximately 9 is the optimum pH for etchants of the invention.

Example III

In order to determine the relative effects of variation of concentration of ammonium fluoride in the etchant of the invention, a series of six wafers produced in Example I were immersed in etchant solutions of varying molar concentrations. The pH of each solution was adjusted to 9 by the addition of ammonium hydroxide. The etchant solutions were heated to 93°–95° C., the wafers immersed in the respective solutions, and the etch rate, definition, and other effects noted and recorded. The results are summarized in the following table:

TABLE II

[Temperature 93–95° C., pH 9.0]

| $NH_4F$ Conc. (M) | Etch Rate (A./sec.) | Observations | | |
|---|---|---|---|---|
| | | Definition | Rainbow | Other |
| 13.6 | 48 | Very good | Observed | Uneven bubbles. |
| 12.0 | 56 | do | do | Resist lifting, uneven bubbles. |
| 10.0 | 75 | do | Not observed | Even bubbles. |
| 8.0 | 19 | do | Observed | Uneven bubbles. |
| 6.0 | 9.5 | do | Broad | Resist lifting, uneven bubbles. |
| 4.0 | 6.8 | do | Very broad | Resist lifting, no bubbles. |

As the table indicates, the most rapid and desirable etch rate was obtained from etchants having an ammonium fluoride concentration in the intermediate range, that is, approximately 10 M. It was also noted that varying the concentration of the etchant had no significant effect on the definition. Very good definition was obtained with all of the etchant solutions. The slower etch rates produced a greater degree of undercutting of the photo resist coating and the resultant formation of a more tapered boundary. The optimum ammonium fluoride concentration in the etchant of the invention appears to be 10 M. At the slower etch rates, experienced when using lower concentration in the etchants of $NH_4F$, there occurred lifting of the photo resist coating. This was also true of the high $NH_4F$ concentrations. The formation of even bubbles about about the annulus of the holes in the mask indicates and even etching, whereas uneven bubbles indicated an uneven and less desirable etching action.

Example IV

In order to determine the effect of variation in temperature on the action of the etchants of the invention, a series of seven wafers produced in Example I were immersed in etchants maintained at different temperatures. The etchants all had a 10 M concentration of ammonium fluoride and a pH of 9. The various etchant solutions were heated to temperatures ranging from 61–100° C., the wafers immersed therein in the respective solutions, and the etch rate, definition, and other effects noted and recorded. The results are summarized in the following table:

TABLE III

10 M $NH_4F$+10% $NH_4OH$ (58%) pH-9

| Temperature (° C.) | Etch Rate (A./sec.) | Observations | | |
|---|---|---|---|---|
| | | Definition | Rainbow | Other |
| 61 | 9.4 | Very good | Barely observed | |
| 70 | 14.1 | do | do | |
| 77 | 23 | do | do | |
| 82 | 42 | Excellent | do | |
| 87 | 56 | Very good | Broad | Resist lifting. |
| 93 | 84 | do | do | Do. |
| 100 | 195 | do | Very broad | Do. |

The etch rate was observed to increase monotomically with increase in temperature. However, at higher etchant temperatures lifting of the photo resist coating resulted. Good definition was obtained at all etchant temperatures with the best definition obtained at 82° C. A more pronounced rainbow effect was observed at the higher etchant solution temperatures indicating a tapered boundary in the silicon monoxide coating. This was apparently caused by lifting of the photo resist coating at the higher solution temperatures.

While the invention has been particularly shown and described with reference to preferred embodiments thereof, it will be understood by those skilled in the art that various changes in form and detail may be made therein without departing from the spirit and scope of the invention.

What is claimed is:

1. An etchant for silicon monoxide comprising,
an aqueous solution of ammonium fluoride and ammonium hydroxide, said solution containing ammonium fluoride in a concentration of approximately 10 moles per liter, and having a pH in the range of 8–10.

2. An etchant for silicon monoxide comprising,
an aqueous alkaline solution of ammonium fluoride in a concentration of from 8–12 moles per liter, said solution having a pH in the range of 8–10.

3. An etchant for silicon monoxide comprising,
an aqueous alkaline solution of ammonium fluoride having a concentration in the range of 8–12 moles per liter.

4. A method of masking a base comprising,
forming a silicon monoxide coating on the surface of the base,
forming a photo resist coating over the silicon monoxide coating,
removing a predetermined area of the photo resist coating,
immersing the resultant coated and masked base in an etchant solution maintained at a temperature in the range of 75–95° C. thus removing the exposed and unmasked silicon monoxide coating,
said etchant solution comprising an aqueous solution of ammonium fluoride and ammonium hydroxide, said solution containing ammonium fluoride in a concentration of 8–12 moles per liter, and having a pH in the range of 8–10.

5. A method of masking a substrate comprising,
forming a silicon monoxide coating on the surface of the substrate,
forming a masking coating over the silicon monoxide coating, removing a predetermined area of the photo resist coating,
immersing a substrate in a heated etchant solution thus removing the exposed silicon monoxide coating, said etchant solution comprised of an aqueous alkaline solution of ammonium fluoride having a concentration of 8–10 moles per liter.

6. A method of etching a silicon monoxide coating disposed on a semiconductor substrate comprising,
forming a masking coating over at least a portion of the silicon monoxide coating,
immersing the substrate in an etchant solution maintained at a temperature in the range of 75–95° C. thus removing the exposed silicon monoxide coating,
said etchant solution comprising an aqueous solution of ammonium fluoride and ammonium hydroxide, said solution having ammonium fluoride in a concentration of 8–12 moles per liter with a pH in the range of 8–10.

7. A method of etching a silicon monoxide coating comprising,
forming a masking coating over the silicon monoxide coating with predetermined portions thereof exposed,
immersing the resultant lamination in a heated etchant solution thus removing the exposed silicon monoxide coating,
said etchant solution comprised of an aqueous alkaline solution of ammonium fluoride and ammonium hydroxide, said solution having ammonium fluoride in a concentration of 8–12 moles per liter.

8. A method of etching silicon monoxide comprising,
exposing predetermined portions of the silicon monoxide to a heated etchant solution maintained at a temperature in the range of 50–100° C., said etchant solution comprised of an aqueous alkaline solution of ammonium fluoride having a concentration in the range of 1–14 moles per liter.

9. The method of claim 8 wherein the ammonium fluoride concentration is 10 moles per liter and the pH of the solution is 9.

10. An etchant for silicon monoxide comprising an aqueous alkaline solution of ammonium fluoride in a concentration of 10 moles per liter, said solution having a pH of 9.

References Cited

UNITED STATES PATENTS

| | | | |
|---|---|---|---|
| 3,122,817 | 3/1964 | Andrus | 29—25.3 |
| 3,133,840 | 5/1964 | Gibson et al. | 148—189 |

JACOB H. STEINBERG, *Primary Examiner.*

U.S. Cl. X.R.

252—79.5; 96—36; 148—189, 1.5; 29—578